(12) United States Patent
Lee et al.

(10) Patent No.: US 10,490,552 B2
(45) Date of Patent: Nov. 26, 2019

(54) FINFET DEVICE HAVING FLAT-TOP EPITAXIAL FEATURES AND METHOD OF MAKING THE SAME

(71) Applicant: Taiwan Semiconductor Manufacturing Co., Ltd., Hsin-Chu (TW)

(72) Inventors: Yi-Jing Lee, Hsinchu (TW); Li-Wei Chou, Pingtung County (TW); Ming-Hua Yu, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/277,478

(22) Filed: Sep. 27, 2016

(65) Prior Publication Data

US 2017/0186748 A1 Jun. 29, 2017

Related U.S. Application Data

(60) Provisional application No. 62/272,369, filed on Dec. 29, 2015.

(51) Int. Cl.
*H01L 27/092* (2006.01)
*H01L 29/06* (2006.01)
(Continued)

(52) U.S. Cl.
CPC .... *H01L 27/0924* (2013.01); *H01L 21/30625* (2013.01); *H01L 21/823814* (2013.01);
(Continued)

(58) Field of Classification Search
CPC ............... H01L 27/0924; H01L 29/36; H01L 29/41791; H01L 21/823821; H01L 21/823814
See application file for complete search history.

(56) References Cited

U.S. PATENT DOCUMENTS 7,667,271 B2 2/2010 Yu et al.
8,362,575 B2 1/2013 Kwok et al.
(Continued)

FOREIGN PATENT DOCUMENTS

CN 104347425 A 2/2015

OTHER PUBLICATIONS

U.S. Appl. No. 15/051,072, filed Feb. 23, 2016, by inventors Yi-Jing Lee, Tsz-Mei Kwok, Ming-Hua Yu for "Structure and Method for Semiconductor Device," 14 pages of text and 10 pages of drawings.

*Primary Examiner* — Matthew C Landau
*Assistant Examiner* — Mark Hatzilambrou
(74) *Attorney, Agent, or Firm* — Haynes and Boone, LLP

(57) ABSTRACT

A semiconductor device includes a substrate, an isolation structure over the substrate, two fins over the substrate and protruding out of the isolation structure, and an epitaxial feature over the two fins. The epitaxial feature includes two lower portions and one upper portion. The two lower portions are over the two fins respectively. The upper portion is over the two lower portions and connects the two lower portions. The upper portion has a different dopant concentration than the two lower portions. A top surface of the upper portion is substantially flat.

20 Claims, 17 Drawing Sheets

(51) Int. Cl.

| | | |
|---|---|---|
| *H01L 29/36* | (2006.01) | |
| *H01L 29/161* | (2006.01) | |
| *H01L 29/08* | (2006.01) | |
| *H01L 29/417* | (2006.01) | |
| *H01L 29/66* | (2006.01) | |
| *H01L 29/78* | (2006.01) | |
| *H01L 21/8238* | (2006.01) | |
| *H01L 21/306* | (2006.01) | |
| *H01L 21/02* | (2006.01) | |

(52) U.S. Cl.
CPC ........ *H01L 21/823821* (2013.01); *H01L 21/823871* (2013.01); *H01L 29/0649* (2013.01); *H01L 29/0847* (2013.01); *H01L 29/161* (2013.01); *H01L 29/36* (2013.01); *H01L 29/41783* (2013.01); *H01L 29/41791* (2013.01); *H01L 29/66795* (2013.01); *H01L 29/785* (2013.01); *H01L 21/0262* (2013.01); *H01L 21/02532* (2013.01); *H01L 21/02636* (2013.01)

(56) References Cited

U.S. PATENT DOCUMENTS

| | | |
|---|---|---|
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 9,287,264 B1 * | 3/2016 | Cheng ............... H01L 27/0924 |
| 9,287,382 B1 | 3/2016 | Lee et al. |
| 2011/0068407 A1 | 3/2011 | Yeh et al. |
| 2012/0091538 A1 * | 4/2012 | Lin .................. H01L 29/66795 257/401 |
| 2012/0153387 A1 * | 6/2012 | Murthy ............ H01L 21/28512 257/335 |
| 2013/0011983 A1 | 1/2013 | Tsai et al. |
| 2013/0171790 A1 * | 7/2013 | Wang ............... H01L 29/66795 438/283 |
| 2014/0065782 A1 | 3/2014 | Lu et al. |
| 2014/0252412 A1 * | 9/2014 | Tsai ................. H01L 21/02521 257/192 |
| 2014/0299934 A1 | 10/2014 | Kim et al. |
| 2015/0303118 A1 * | 10/2015 | Wang ............. H01L 21/823481 257/401 |
| 2016/0268171 A1 * | 9/2016 | Wei ................. H01L 21/823807 |
| 2016/0315172 A1 * | 10/2016 | Wu .................... H01L 29/0847 |

* cited by examiner

FinFET DEVICE HAVING FLAT-TOP EPITAXIAL FEATURES AND METHOD OF MAKING THE SAME

PRIORITY DATA

This application claims the benefit of U.S. Prov. App. No. 62/272,369 entitled "FinFET Device Having Flat-Top Epitaxial Features and Method of Making the Same," filed Dec. 29, 2015, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices are scaled down progressively, strained source/drain (S/D) features (e.g., stressor regions) have been implemented using epitaxial (epi) semiconductor materials to enhance carrier mobility and improve device performance. Forming a MOSFET with stressor regions often epitaxially grows silicon (Si) to form raised S/D features for an n-type device, and epitaxially grows silicon germanium (SiGe) to form raised S/D features for a p-type device. Various techniques directed at shapes, configurations, and materials of these S/D features have been implemented to further improve transistor device performance. Although existing approaches in S/D formation have been generally adequate for their intended purposes, they have not been entirely satisfactory in all respects. For example, S/D contact resistance has become an increasingly prominent factor in circuit performance as the transistors are scaled down. It is highly desirable to have reduced S/D contact resistance as it leads to reduced power consumption and faster circuit speed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
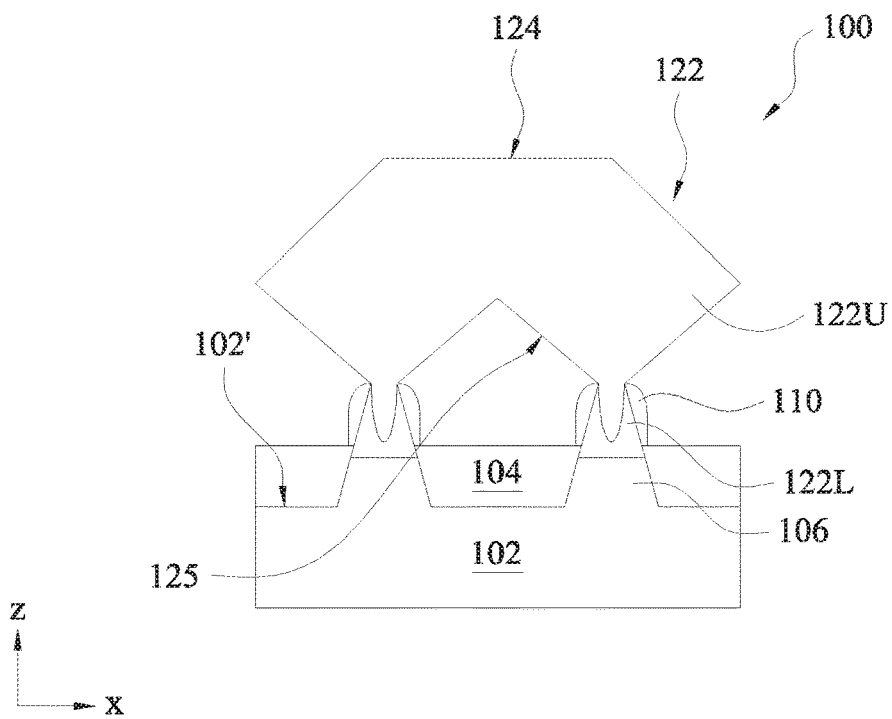
FIGS. 1A, 1B, 1C, and 1D illustrate various embodiments of a semiconductor device constructed according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments is generally related to semiconductor devices and methods of forming the same. In particular, the present disclosure is related to forming raised S/D features in field effect transistors (FETs) including FETs having fin-like channels (FinFETs). In some embodiments, the present disclosure provides raised S/D features that merge from multiple epitaxial features and the raised S/D features each provide a substantially flat top surface. The flat top surface provides larger contact area than the multiple individual epitaxial features aggregated. When S/D contacts are formed over the raised S/D features, the flat top surfaces help reduce the respective resistance of the S/D contacts due to the large contact areas.

FIG. 1A shows a semiconductor device 100 constructed according to various aspects of the present disclosure. The device 100 may be an intermediate device fabricated during processing of an IC, or a portion thereof, that may comprise static random access memory (SRAM) and/or logic circuits, passive components such as resistors, capacitors, and inductors, and active components such as p-type FETs (PFETs), n-type FETs (NFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, fins, gate stacks, device regions, and other features in various embodiments are provided for simplification and ease of understanding and do not necessarily limit the embodiments to any types of devices, any number of devices, any number of regions, or any configuration of structures or regions. For example, the same inventive concept can be applied in fabricating planar FET devices and multi-gate devices.

Referring to FIG. 1A, in this embodiment, the device 100 includes a substrate 102, an isolation structure 104 over the substrate 102, and two or more fins 106 (two shown in FIG. 1A) over the substrate 102 and protruding out of the isolation structure 104. Further in this embodiment, the device 100 includes an epitaxial feature 122 that comprises an upper portion 122U and two or more lower portions 122L (two shown in FIG. 1A). The lower portions 122L are disposed over the respective fins 106 and are at least partially surrounded by a fin sidewall dielectric layer 110. In the present embodiment, the lower portions 122L are lower than the fin sidewall dielectric layer 110 along the "z" direction (a fin height direction). The lower portions 122L are physically connected to each other through the upper portion 122U. The upper portion 122U provides a top surface 124 which is substantially flat. In an embodiment, the top surface 124 is substantially parallel to a top surface 102' of the substrate 102. A bottom surface 125 of the upper portion 122U may be flat or non-flat in various embodiments. The various features of the device 100 are further described below.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as having a buried dielectric layer. In embodiments, the substrate 102 includes active regions such as p-wells and n-wells for forming active devices.

The fins 106 may be p-type fins for forming PFETs or n-type fins for forming NFETs. The fins 106 may comprise substantially the same semiconductor material as the substrate 102. Although not shown in FIG. 1A, each of the fins 106 includes a channel region and two S/D regions sandwiching the channel region. FIG. 1A shows a sectional view of the device 100 cut across one of the S/D regions of the fins 106. The fins 106 are separated by the isolation structure 104. The isolation structure 104 may comprise silicon oxide, silicon nitride, silicon oxynitride, fluoride-doped silicate glass (FSG), a low-k dielectric material, and/or other suitable insulating material. The isolation structure 104 may be shallow trench isolation (STI) features in some embodiments. The dielectric layer 110 is disposed over the isolation structure 104 and adjacent to the S/D regions of the fins 106. The dielectric layer 110 at least partially surrounds the lower portions 122L. In an embodiment, the dielectric layer 110 comprises a nitride such as silicon nitride, silicon oxynitride, or silicon carbon nitride. The upper portion 122U is disposed over the dielectric layer 110 and the lower portions 122L.

In an embodiment, the lower portions 122L and the upper portion 122U each include silicon doped with an n-type dopant, such as phosphorus (P) or arsenic (As), for forming NFET devices. Further, the upper portion 122U comprises a higher concentration of the n-type dopant than the lower portions 122L do. In one example, the upper portion 122U comprises silicon doped with phosphorus having a dopant concentration ranging from $1e^{21}$ $cm^{-3}$ to $5e^{21}$ $cm^{-3}$, while the lower portions 122L comprise silicon doped with phosphorus having a dopant concentration ranging from $1e^{20}$ $cm^{-3}$ to $1e^{21}$ $cm^{-3}$. In another embodiment, the lower portions 122L and the upper portion 122U each include silicon germanium doped with a p-type dopant, such as boron (B) or indium (In), for forming PFET devices. In a further embodiment, the upper portion 122U comprises a higher concentration of the p-type dopant than the lower portions 122L do.

Figure 1B:
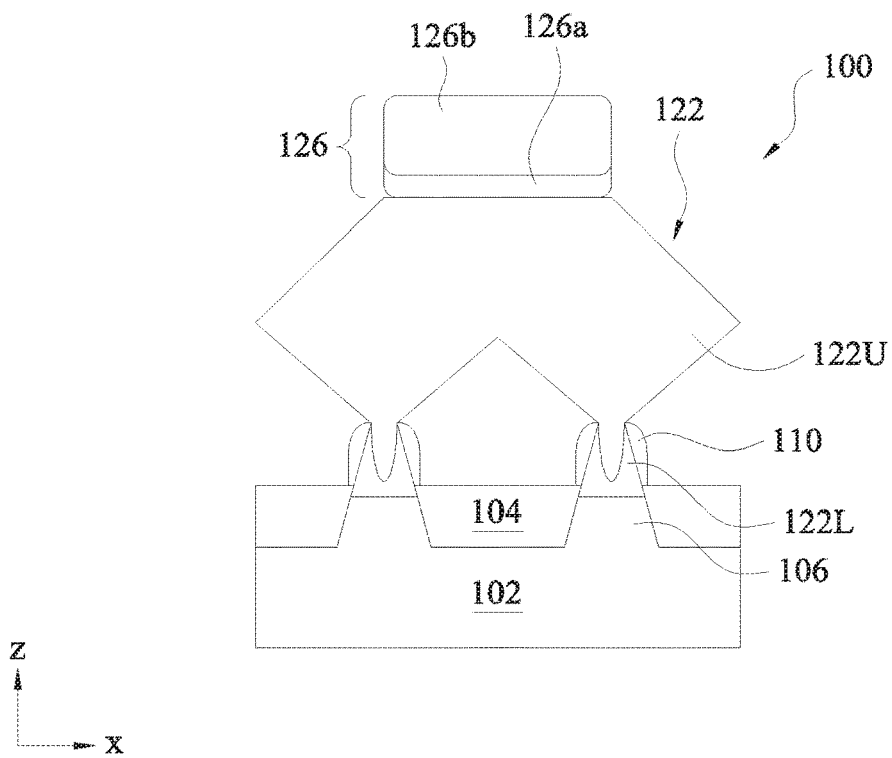

Referring to FIG. 1B, in an embodiment, the device 100 further includes a contact feature 126 formed over the epitaxial feature 122. Particularly, the contact feature 126 is disposed over the flat top surface 124. In embodiments, the contact feature 126 may include a barrier layer 126a and a conductive layer 126b over the barrier layer 126a. For example, the conductive layer 126b may include aluminum (Al), tungsten (W), copper (Cu), cobalt (Co), combinations thereof, or other suitable material; and the barrier layer 126a may include a metal nitride, such as TaN, for preventing the metal elements of the conductive layer 126b from migrating to adjacent features. In various embodiments, the interface between the contact feature 126 and the epitaxial feature 122 provides reduced resistance compared with traditional structures. Traditional epitaxial features typically have rhombus-like cross-sectional profile and are either isolated from each other (unmerged), or merged into a shape with a non-flat top surface having ridges and valleys. In many cases with the traditional epitaxial features, only parts (e.g., the ridges) of the top surface(s) of the epitaxial features directly interface with the contact features above. In comparison, the top surface 124 of the epitaxial feature 122 is substantially flat, providing a larger interface with the contact feature 126 than the traditional epitaxial features would.

Figure 1C:
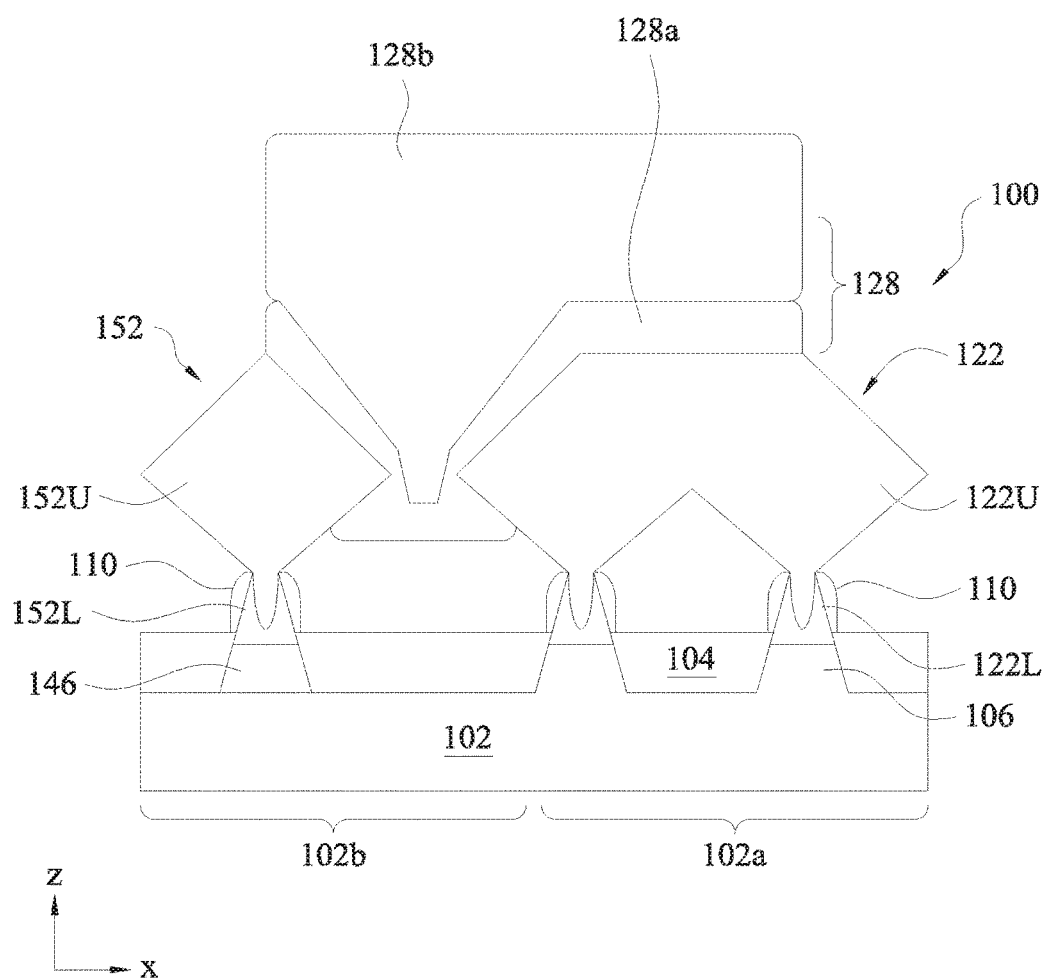

Referring to FIG. 1C, in another embodiment, the device 100 includes a region 102a and an adjacent region 102b. The region 102a includes the various features 106 and 122 discussed above. The region 102b includes a fin 146 and an epitaxial feature 152 over the fin 146. The epitaxial feature 152 comprises a lower portion 152L and an upper portion 152U over the lower portion 152L. The dielectric layer 110 at least partially surrounds the lower portion 152L. In the present embodiment, the lower portion 152L is lower than the fin sidewall dielectric layer 110 along the "z" direction. The upper portion 152U is disposed over the dielectric layer 110. Further in this embodiment, the device 100 includes a contact feature 128 that interfaces with both the epitaxial features 122 and 152. The contact feature 128 includes a barrier layer 128a and a conductive layer 128b over the barrier layer 128a. The barrier layer 128a and the conductive layer 128b may have the same or similar composition as the barrier layer 126a and the conductive layer 126b respectively. In this embodiment shown, the epitaxial feature 152 has a rhombus shaped cross-sectional profile and a portion of the contact feature 128 is disposed over a side of the epitaxial feature 152. Particularly in this embodiment, a portion of the contact feature 128 is disposed between the epitaxial features 122U and 152U and below the widest part (along the x direction) of the epitaxial feature 122U and/or the epitaxial feature 152U. In another embodiment, the region 102b may include epitaxial features that are shaped like the epitaxial feature 122, i.e., having substantially flat top surfaces on which the contact feature 128 may be disposed. In an embodiment, the features in the region 102a form an n-type transistor (e.g., NMOS) and the features in the region 102b form a p-type transistor (e.g., PMOS). In an alternative embodiment, the features in the region 102a form a p-type transistor (e.g., PMOS) and the features in the region 102b form an n-type transistor (e.g., NMOS).

Figure 1D:
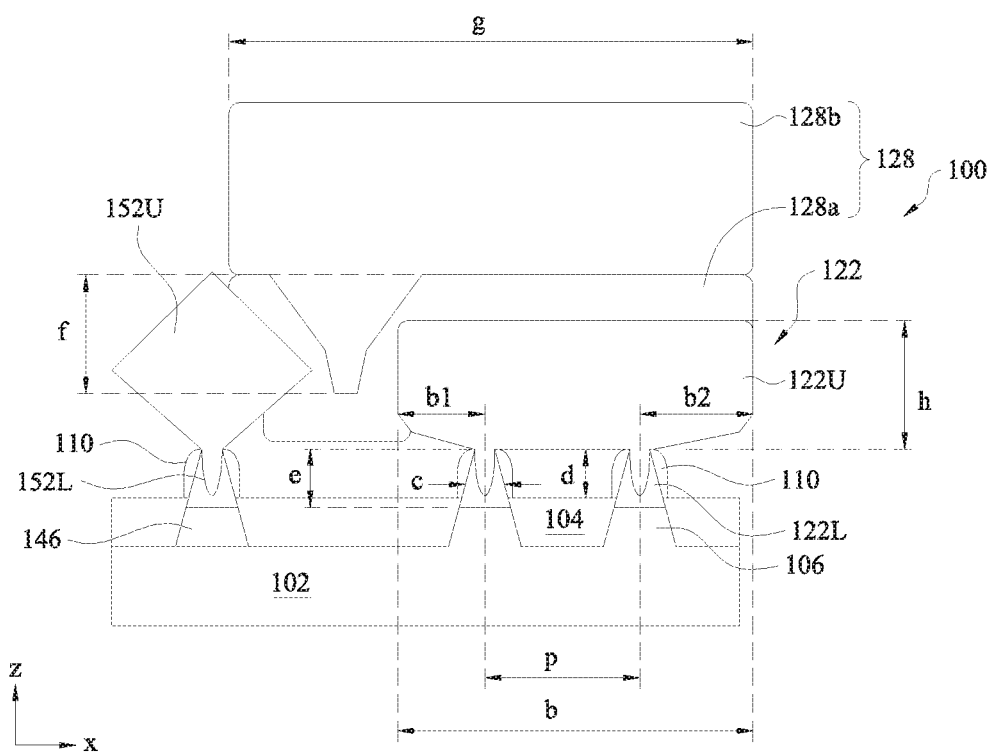

Referring to FIG. 1D, various dimensions of the device 100, particularly the epitaxial feature 122, are illustrated in another embodiment. The shape of the upper portion 122U in FIG. 1D is close to a rectangular bar: both of its top and bottom surfaces are flat or almost flat. One of the differences between the upper portions 122U in the two embodiments (FIGS. 1C and 1D) is their side surfaces. The upper portion 122U of FIG. 1C has slanted side surfaces facing upwards and downwards, while the upper portion 122U of FIG. 1D has near vertical side surfaces. Another difference between the upper portions 122U in the two embodiments (FIGS. 1C and 1D) is their bottom surfaces. The upper portion 122U of FIG. 1C has slanted bottom surfaces facing downwards, while the upper portion 122U of FIG. 1D has a near flat (horizontal) bottom surface. In the embodiment shown in FIG. 1D, the fins 106 have a fin pitch "p" along a fin width direction (the "x" direction). The fin pitch "p" is also the pitch of the lower portions 122L. In embodiments, the pitch "p" is tuned for the process node and for forming the flat top 124 in the epitaxial feature 122. If "p" is too small, the upper portion 122U may merge so early in the epitaxial growth process that it will be grown into a rhombus shape, instead of a shape having a flat-top surface. If "p" is too big, the upper portion 122U may not merge at all. In an example, the pitch "p" is tuned to range from 30 nanometers (nm) to 50 nm.

In various embodiments such as shown in FIGS. 1A and 1D, the upper portion 122U extends beyond the lower portions 122L and the fins 106 along the "x" direction. The upper portion 122U has a dimension "b" along the "x" direction and a dimension "h" along the fin height direction (the "z" direction). In embodiments, the dimension "b" is greater than the dimension "h." In examples, the dimension "b" ranges from 55 nm to 75 nm. Further, the portions of the upper portion 122U that extend beyond a left side and a right side of the lower portions 122L (as well as the two fins 106) may be asymmetrical. In the embodiment shown in FIG. 1D, the upper portion 122U extends beyond the left side of the lower portions 122L by a dimension "b1" and the right side a dimension "b2." Each of the dimensions "b1" and "b2" may range from 10 nm to 25 nm in some embodiments.

Still referring to FIG. 1D, the dielectric layer 110 has a height "d" along the "z" direction, and the height "d" may range from 5 nm to 25 nm in various embodiments. As will be discussed below, the height "d" contributes to the various shapes and dimensions of the epitaxial feature 122. The lower portions 122L each have a width "c" along the "x" direction, measured at approximately the half-height of the lower portion 122L. The width "c" may range from 6 nm to 15 nm in some embodiments. Further, the lower portions 122L each have a height "e" along the "z" direction. The height "e" may range from 3 nm to 15 nm in some embodiments. The conductive layer 128b has a width "g" that may range from about 100 nm to about 250 nm in some embodiments. The conductive layer 128b may be wider at its top than at its bottom (e.g., a trapezoid). A lower portion of the conductive layer 128b extends downwards from a top surface of the barrier layer 128a. This lower portion is disposed between the epitaxial features 122U and 152U, and has a depth "f" (along the z direction) that ranges from 20 to 50 nm in some embodiments. The interface between the contact feature 128 and the epitaxial features is further enlarged due to the presence of this lower portion of the conductive layer 128b.

Figure 2:
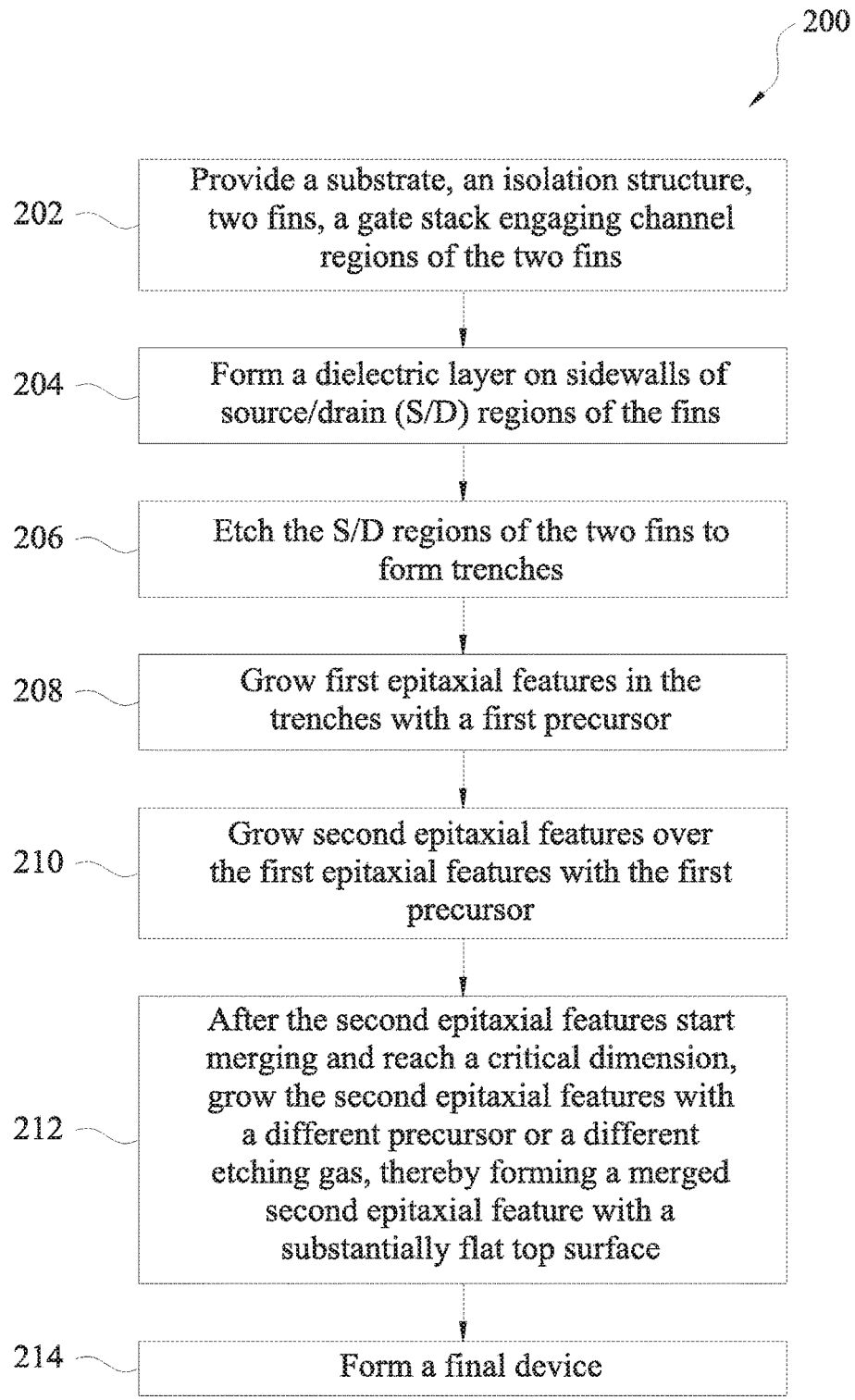
FIG. 2 shows a block diagram of a method of forming a semiconductor device, according to various aspects of the present disclosure.

FIG. 2 shows a block diagram of a method 200 of forming a semiconductor device, such as the semiconductor device 100, according to various aspects of the present disclosure. The method 200 is an example, and is not intended to limit the present disclosure beyond what is explicitly recited in the claims. Additional operations can be provided before, during, and after the method 200, and some operations described can be replaced, eliminated, or relocated for additional embodiments of the method. The method 200 is described below in conjunction with FIGS. 3-11 which are perspective and cross-sectional views of the semiconductor device 100 according to various aspects of the present disclosure.

Figure 3:
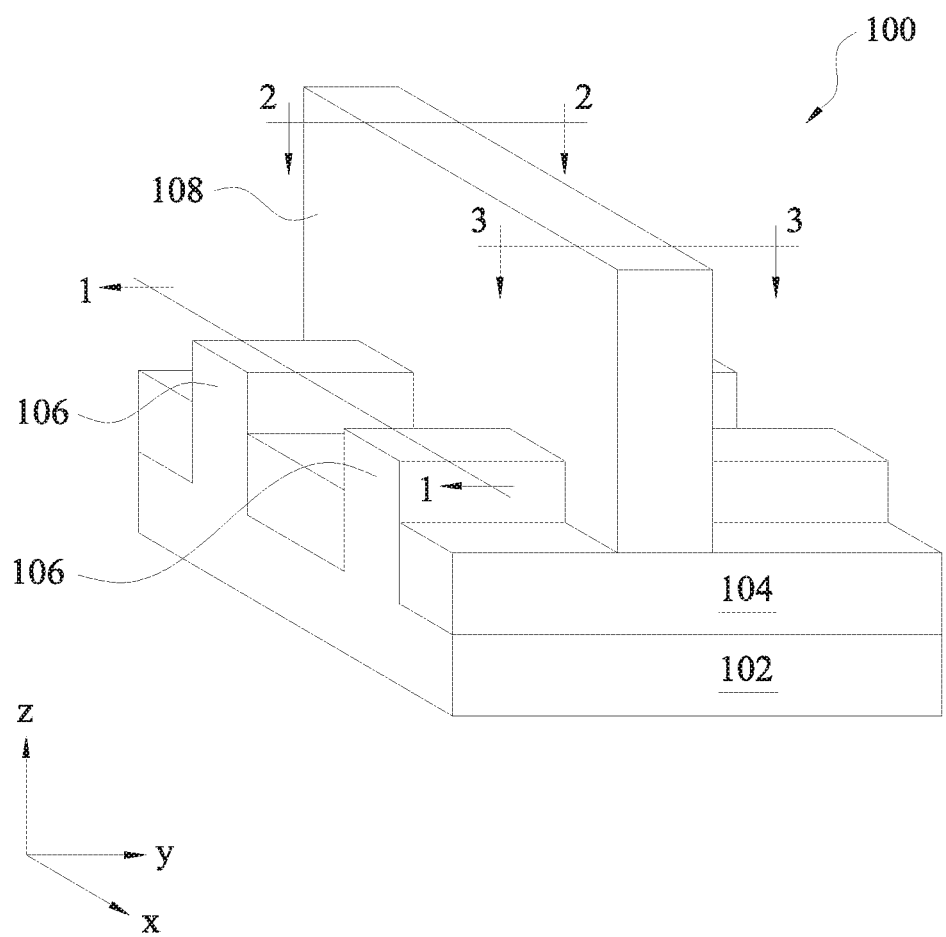
FIG. 3 illustrates a perspective view of a semiconductor device in an intermediate step of fabrication according to an embodiment of the method of FIG. 2.
Figure 4A:
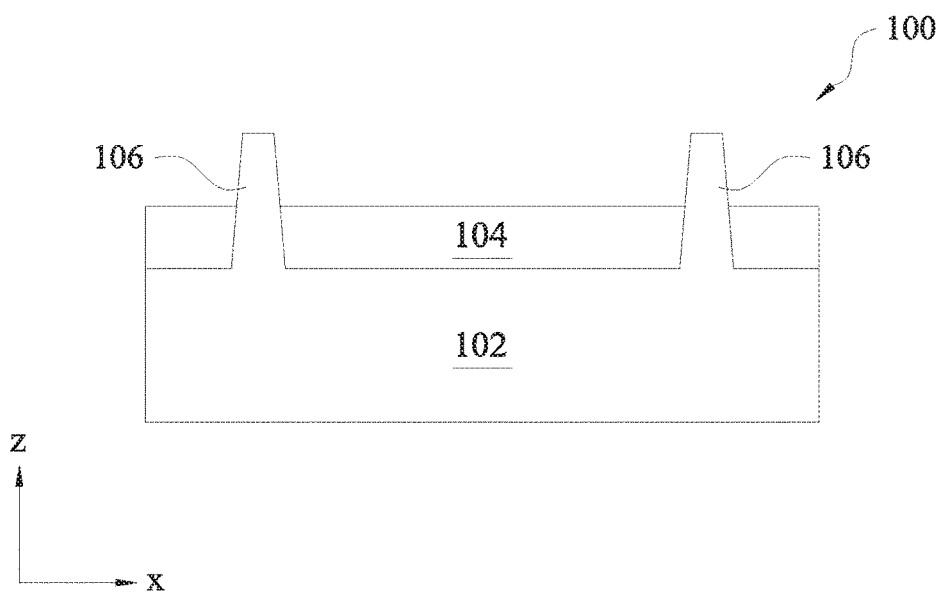
FIGS. 4A, 4B, 4C, 5A, 5B, 5C, 6A, 6B, 7A, 7B, 8A, 8B, 9A, 9B, 10, and 11 illustrate cross sectional views of forming a target semiconductor device according to the method of FIG. 2, in accordance with some embodiments.
Figure 4B:
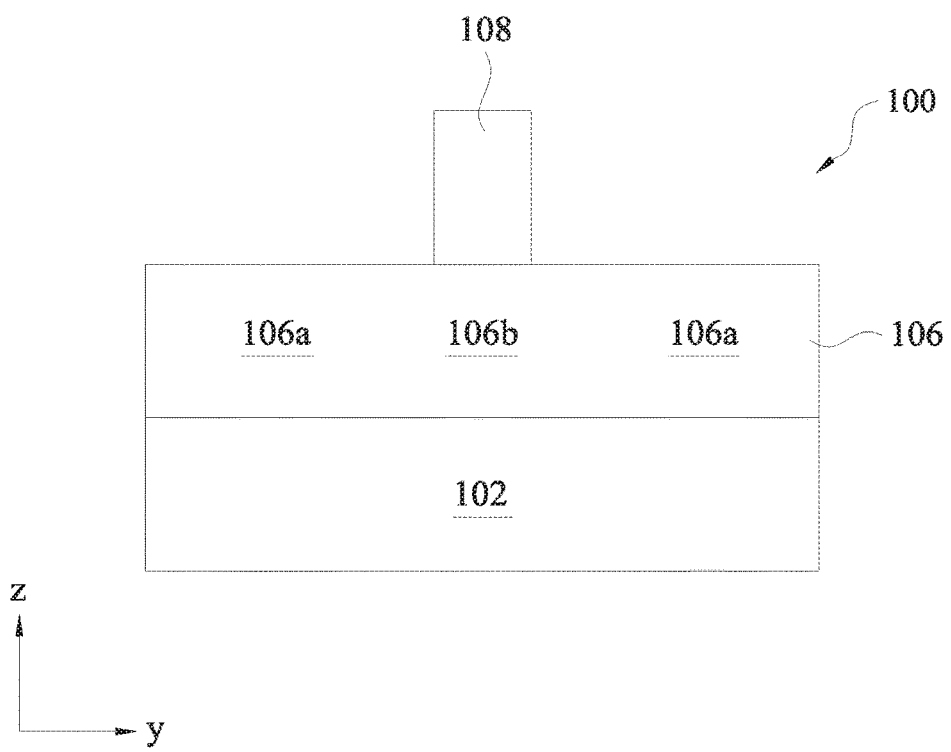
Figure 4C:
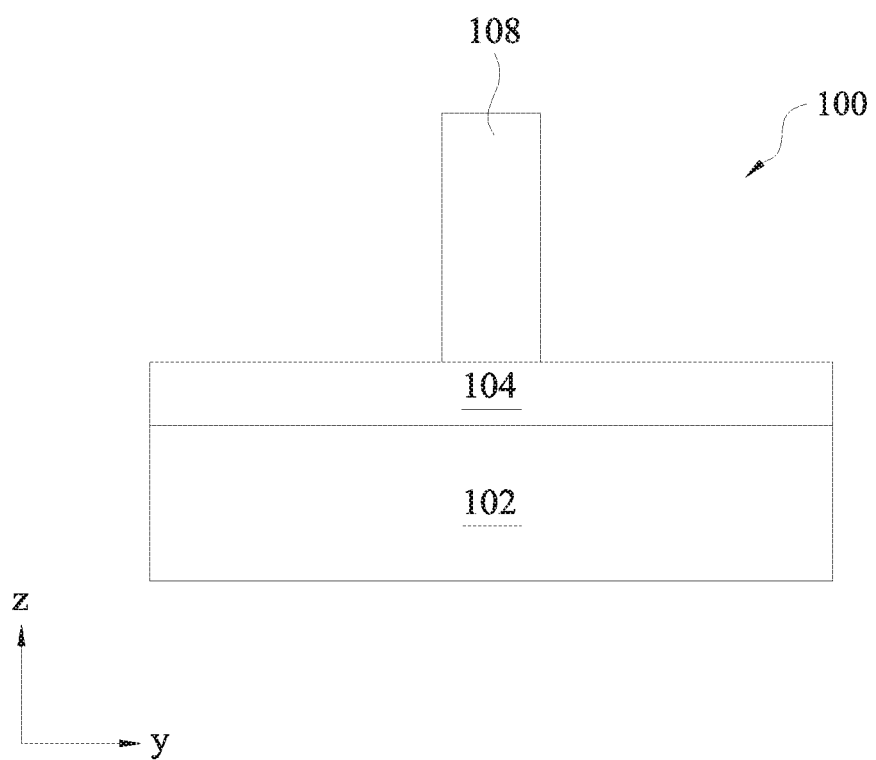

At operation 202, the method 200 (FIG. 2) receives a precursor of the device 100. For the convenience of discussion, the precursor of the device 100 is also referred to as the device 100. FIG. 3 shows a perspective view of the device 100. FIGS. 4A, 4B, and 4C show cross-sectional views of the device 100 along the "1-1," "2-2," and "3-3" lines in FIG. 3 respectively. The "1-1" line cuts the device 100 in the "x-z" plane in S/D regions of the fins 106. The "2-2" line cuts the device 100 in the "y-z" plane along a length of the fins 106. The "3-3" line cuts the device 100 in the "y-z" plane outside the fins 106. Referring to FIGS. 3, 4A, 4B, and 4C collectively, the device 100 includes the substrate 102, the isolation structure 104 over the substrate 102, and the two fins 106 extending from the substrate 102 and through the isolation structure 104. The two fins 106 each have two source/drain (S/D) regions 106a and a channel region 106b interposing the S/D regions 106a. The device 100 further includes a gate stack 108 engaging the fins 106 in the channel regions 106b. Particularly, the gate stack 108 engages the fins 106 on multiple sides thereof, forming a multi-gate device (a FinFET in this case).

The fins 106 may be fabricated using suitable processes including photolithography and etching processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fins 106 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The fins 106 may also be formed using double-patterning lithography (DPL) processes. Numerous other embodiments of methods to form the fins 106 may be suitable.

The isolation structure 104 may be formed by etching trenches in the substrate 102, e.g., as part of the fins 106 formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 104 may include a multi-layer structure, for example, having one or more thermal oxide liner layers.

The gate stack 108 includes a gate dielectric layer and a gate electrode layer. The gate dielectric layer may include silicon oxide or a high-k dielectric material such as hafnium oxide, zirconium oxide, lanthanum oxide, titanium oxide, yttrium oxide, and strontium titanate. The gate dielectric layer may be formed by chemical oxidation, thermal oxidation, atomic layer deposition (ALD), chemical vapor deposition (CVD), and/or other suitable methods. In an embodiment, the gate electrode layer includes polysilicon, and may be formed by suitable deposition processes such as low-pressure chemical vapor deposition (LPCVD) and plasma-enhanced CVD (PECVD). In some embodiments, the gate electrode layer includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer may be formed by CVD, PVD, plating, and/or other suitable processes. In some embodiments, the gate stack 108 is a sacrificial gate structure, i.e., a placeholder for a final gate stack. In some embodiments, the gate stack 108 includes an interfacial layer between its gate dielectric layer and the fins 106. The interfacial layer may include a dielectric material such as silicon oxide or silicon oxynitride, and may be formed by chemical oxidation, thermal oxidation, ALD, CVD, and/or other suitable process. The gate stack 108 may include other layers such as hard mask layer(s).

Figure 5A:
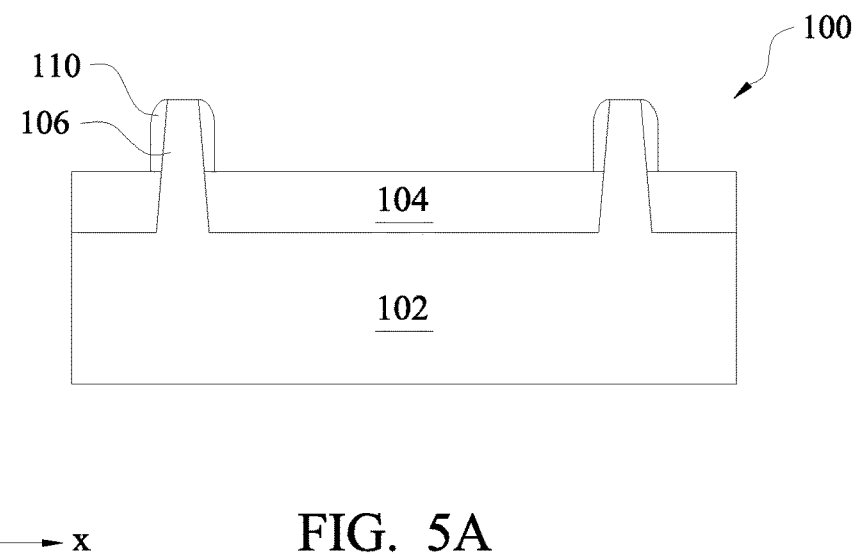
Figure 5B:
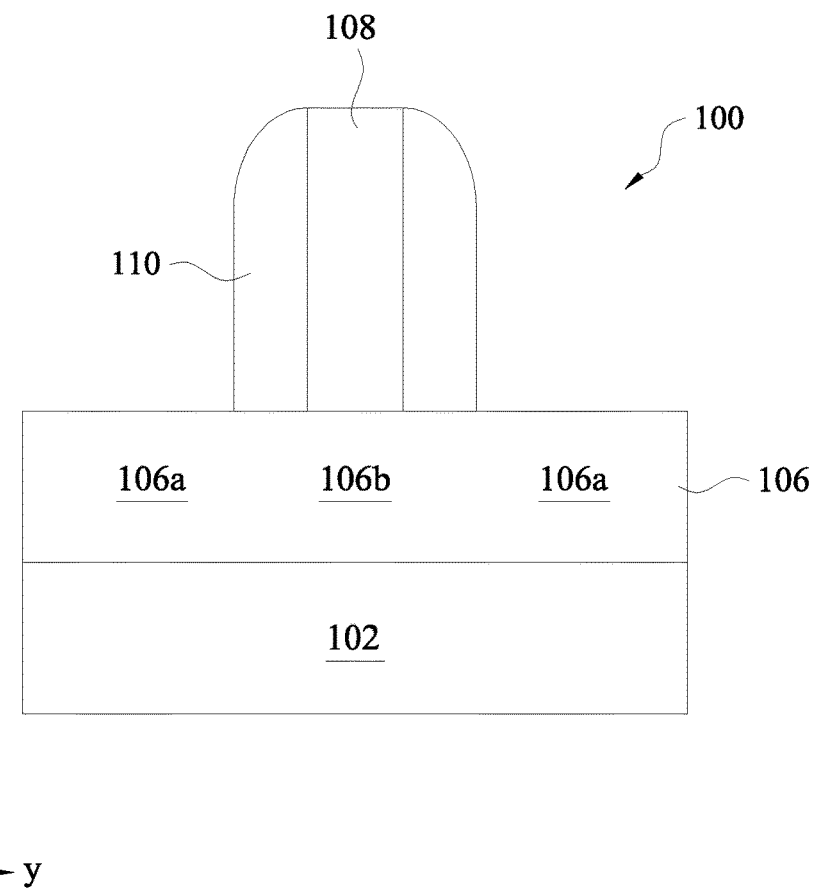
Figure 5C:
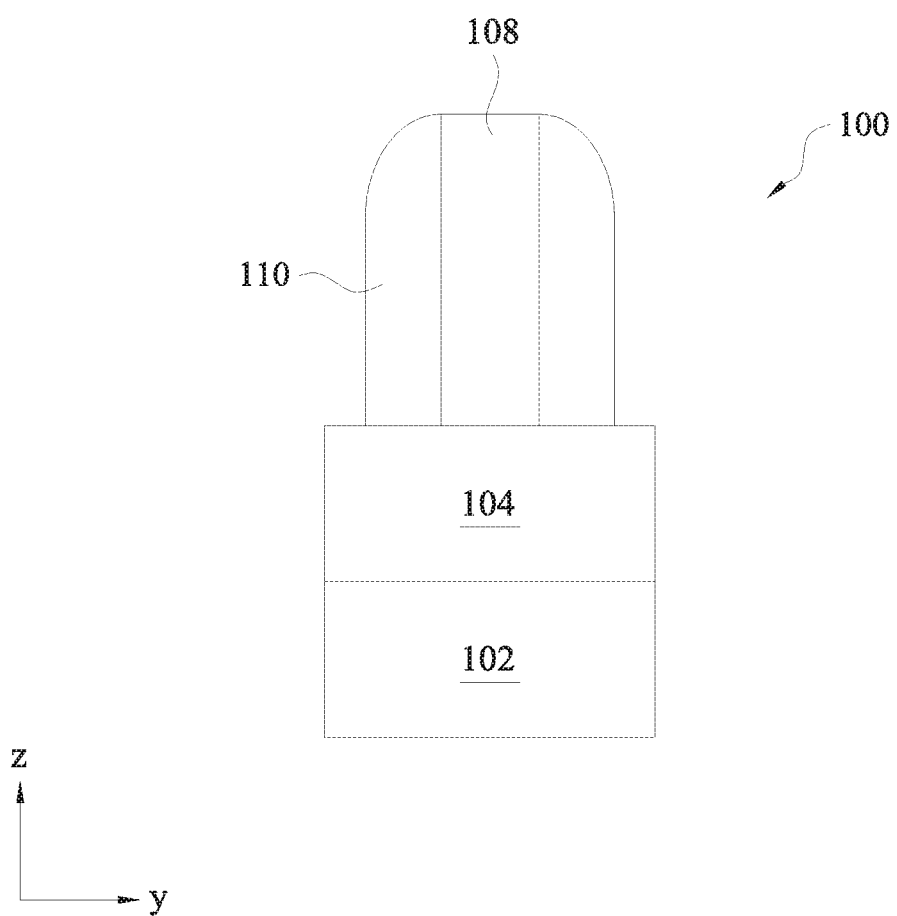

At operation 204, the method 200 (FIG. 2) forms the dielectric layer 110 on sidewalls of the fins 106 in the respective S/D regions 106a. FIGS. 5A, 5B, and 5C illustrate cross-sectional views of the device 100 along the "1-1," "2-2," and "3-3" lines of FIG. 3 respectively after this fabrication step. Referring to FIGS. 5A, 5B, and 5C, the dielectric layer 110 may comprise a single layer or multi-layer structure, and may comprise a dielectric material such as silicon nitride (SiN) or silicon oxynitride. The dielectric layer 110 may be formed by CVD, PECVD, ALD, thermal deposition, or other suitable methods. In the present embodiment, the dielectric layer 110 is also disposed on sidewalls of the gate stack 108. In an embodiment, operation 204 includes a deposition process followed by an etching process. For example, it may deposit a dielectric material over the device 100 as a blanket layer, covering the isolation structure 104, the fins 106, and the gate stack 108. Then, it may perform an anisotropic etching process to remove portions of the dielectric material from top surfaces of the isolation structure 104, the fins 106, and the gate stack 108, leaving remaining portion of the dielectric material on sidewalls of the fins 106 and the gate stack 108 as the dielectric layer 110. In embodiments, the dielectric layer 110 on the sidewalls of the fins 106 has a height of approximately 5 to 25 nm.

Figure 6A:
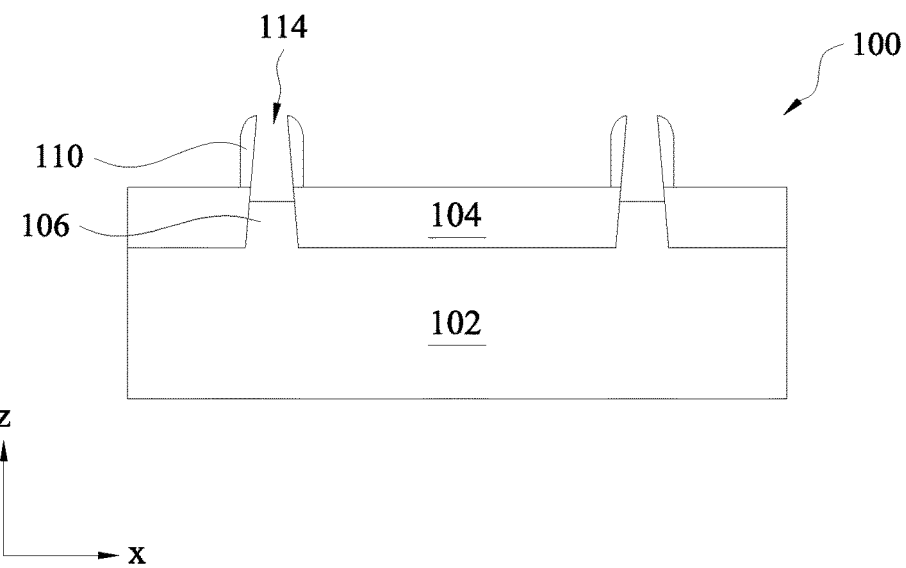
Figure 6B:
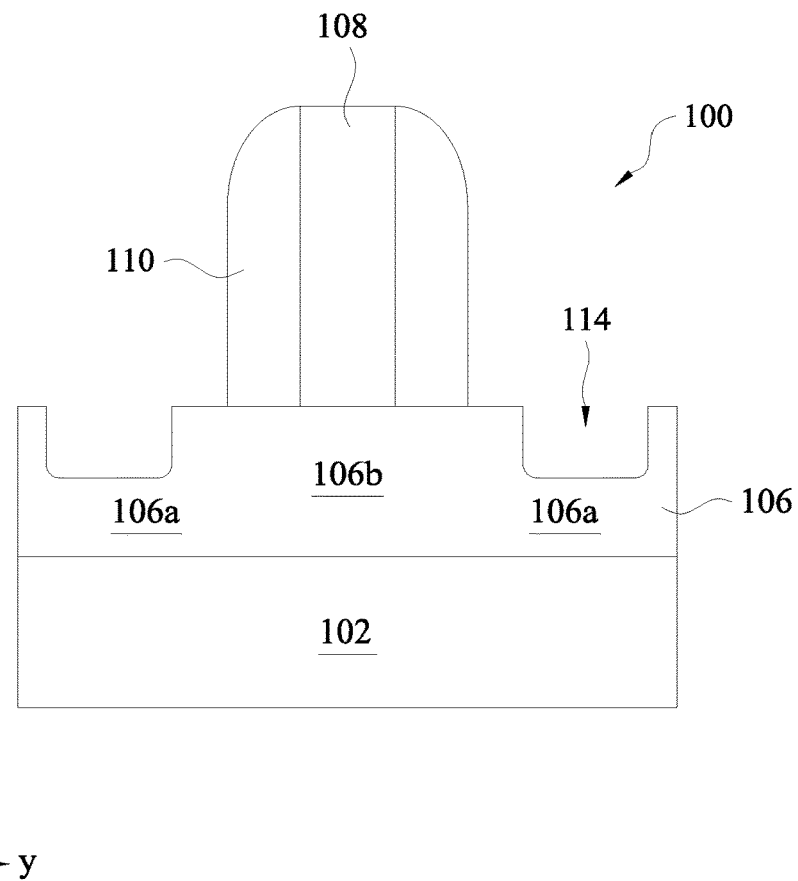

At operation 206, the method 200 (FIG. 2) selectively etches the S/D regions 106a of the fins 106 to form trenches (or recesses) 114 therein. FIGS. 6A and 6B illustrate cross-sectional views of the device 100 along the "1-1" and "2-2" lines of FIG. 3 respectively after this fabrication step. Referring to FIGS. 6A and 6B, the fins 106 are etched below a top surface of the isolation structure 104 in this embodiment. Operation 206 may include one or more photolithography process and etching processes. For example, the photolithography process may form a masking element covering areas of the device 100 that are not intended to be etched. The masking element provides openings through which the fins 106 are etched. The fins 106 may be etched by a dry etching process, a wet etching process, or other etching techniques. In the present embodiment, the etching process is selectively tuned to remove the materials of the fins 106 while the gate stack 108, the dielectric layer 110, and the isolation structure 104 remain substantially unchanged. Operation 206 forms four trenches 114 with two on each side of the gate stack 108. Each trench 114 may have a tapered cross-sectional profile (in the "x-z" plane) with a wider opening at its bottom than at its top. After the etching process, a cleaning process may be performed that cleans the trenches 114 with a cleaning chemical to make the various surfaces therein ready for a subsequent epitaxial growth process. The cleaning chemical may be a hydrofluoric acid (HF) solution, a diluted HF solution, or other suitable cleaning solutions.

Figure 7A:
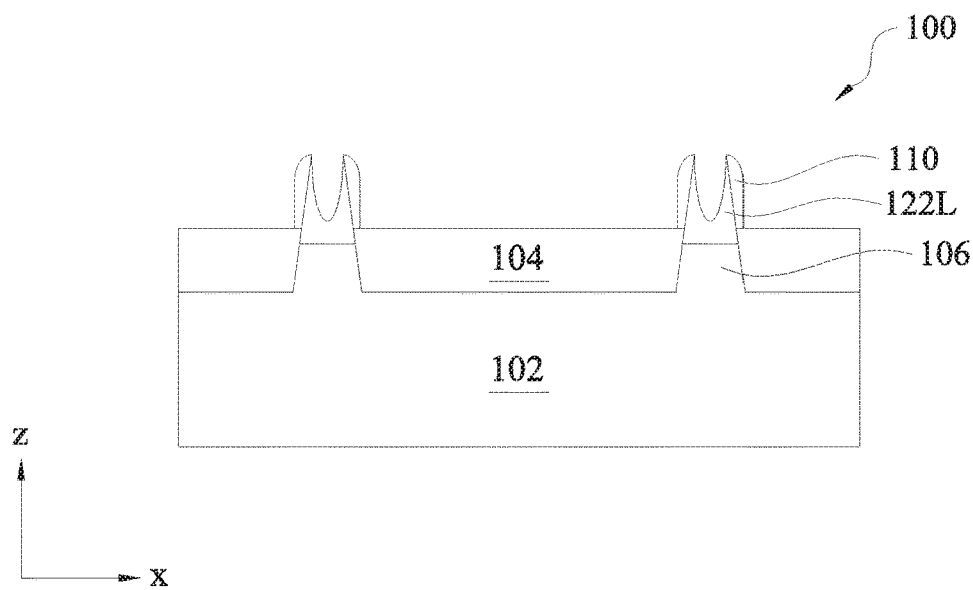
Figure 7B:
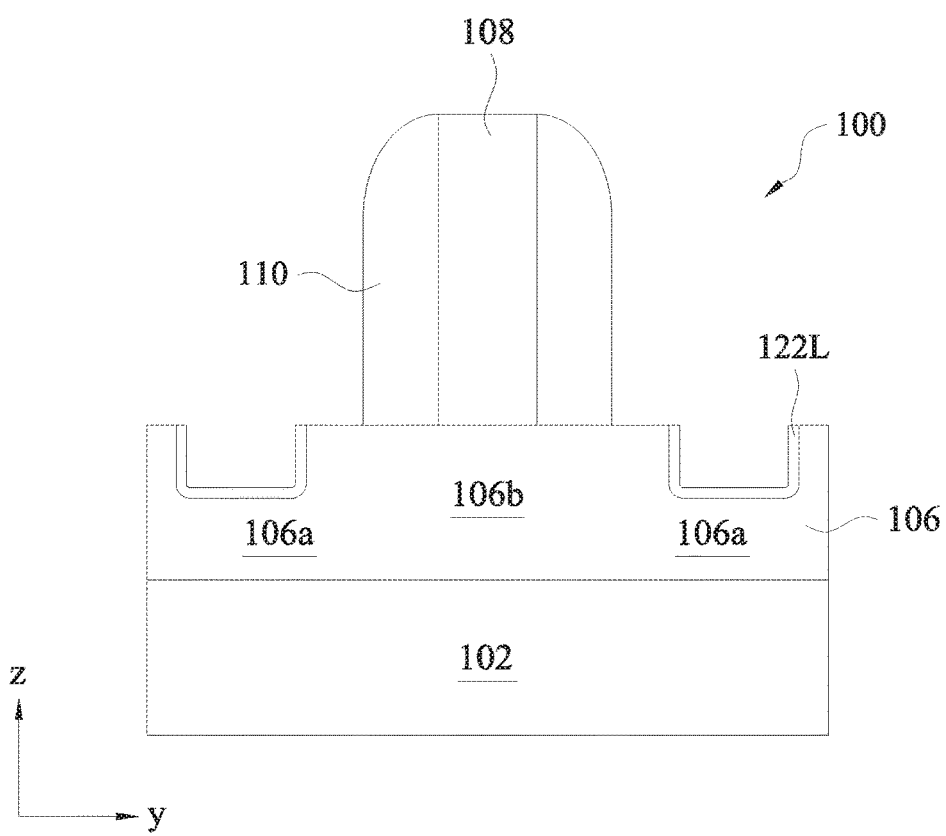

At operation 208, the method 200 (FIG. 2) grows four epitaxial features 122L in the four trenches 114, with one in each trench (FIGS. 7A and 7B). The epitaxial features 122L partially fill the respective trenches 114. The epitaxial growth process may be a LPCVD process with a silicon-based precursor, a selective epitaxial growth (SEG) process, or a cyclic deposition and etching (CDE) process. For example, silicon crystal may be grown with LPCVD with dichlorosilane ($SiH_2Cl_2$) as the precursor. For another example, silicon germanium crystal may be formed with a CDE process using HCl as the etching gas and a gas mixture of $GeH_4$ and $H_2$ as the deposition gas which contains about 1% to about 10% $GeH_4$ in $H_2$. The height of the dielectric layer 110 is tuned to promote the growth of the epitaxial features 122L to a desirable height without too much lateral growth. In various embodiments, the epitaxial features 122L are grown to have a height ranging from 3 nm to 15 nm. The epitaxial features 122L include a semiconductor material suitable for forming raised S/D features. In an embodiment, the epitaxial features 122L include silicon germanium (SiGe) doped with one or more p-type dopants, such as boron or indium. In an embodiment, the epitaxial features 122L include silicon doped with one or more n-type dopants, such as phosphorus or arsenic. The doping may be performed in-situ or ex-situ with the epitaxial growth process.

At operation 210, the method 200 (FIG. 2) grows the upper epitaxial features 122U over the lower epitaxial features 122L. In the present embodiment, the epitaxial features 122U are grown with the same semiconductor material as in the epitaxial features 122L but with different dopant concentration. For example, the epitaxial features 122L and 122U may each include silicon doped with an n-type dopant but the epitaxial features 122U have a higher concentration of the n-type dopant. For another example, the epitaxial features 122L and 122U may each include silicon germanium doped with a p-type dopant but the epitaxial features 122U have a higher concentration of the p-type dopant. Similar to the formation of the epitaxial features 122L, the epitaxial features 122U may be formed using LPCVD, SEG, or CDE techniques.

Figure 8A:
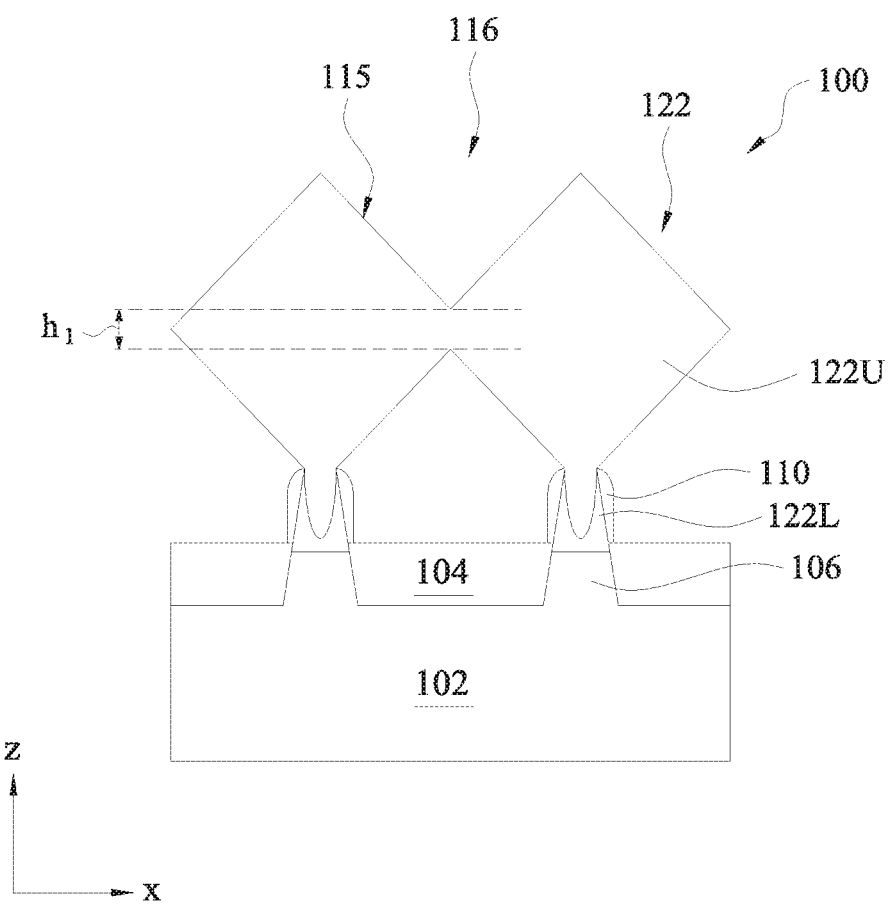
Figure 8B:
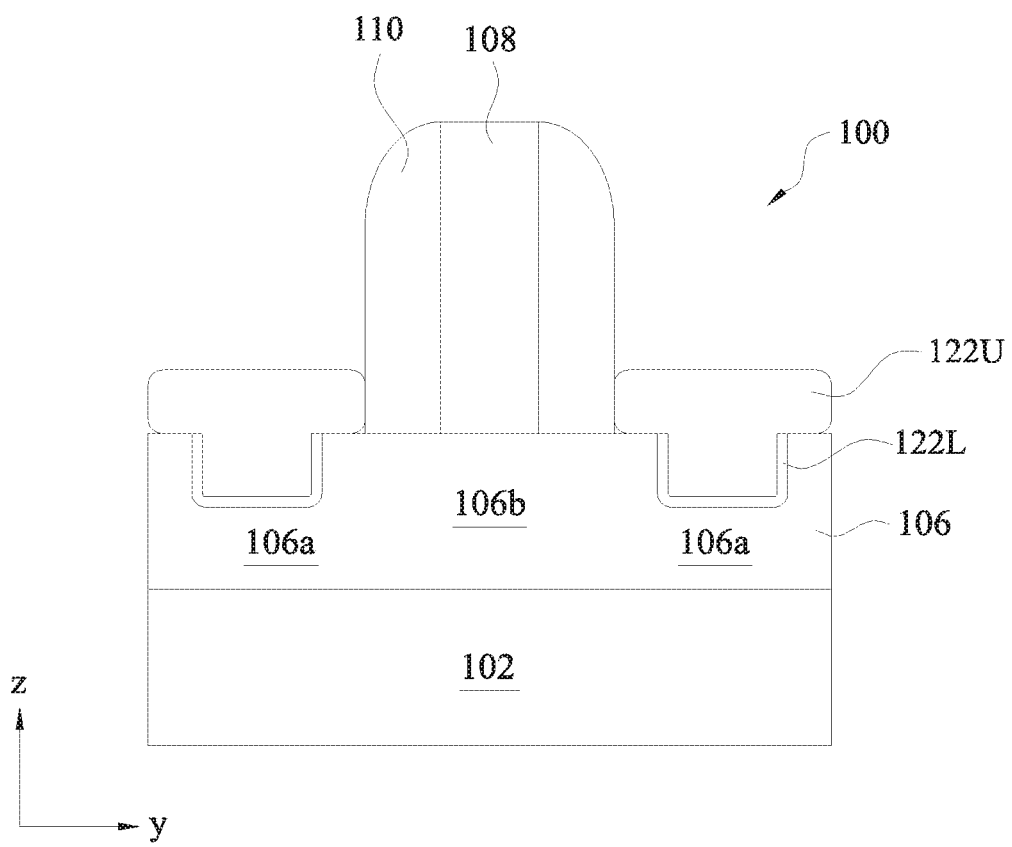

As shown in FIGS. 8A and 8B, the epitaxial features 122U fill the remaining spaces in the respective trenches 114 and further expand laterally once they grow out of the respective trenches 114. As the epitaxial features 122U grow taller and wider, they start to merge, as shown in FIG. 8A which is a cross-sectional view of the device 100 along the "1-1" line of FIG. 3. FIG. 8B illustrates a cross-sectional view of the device 100 along the "2-2" line of FIG. 3 at this fabrication stage. Referring to FIG. 8A, the epitaxial features 122U merge into a connected epitaxial feature, also referred to as the epitaxial feature 122U for the convenience of discussion. Further, at this fabrication stage, the epitaxial feature 122U does not have a flat top surface yet. Instead, it has a curvy top surface 115 with a dip 116. The inventors of the present disclosure have discovered that continuously growing the epitaxial feature 122U under the same epitaxial growth condition may not result in its having a flat top surface.

Figure 9A:
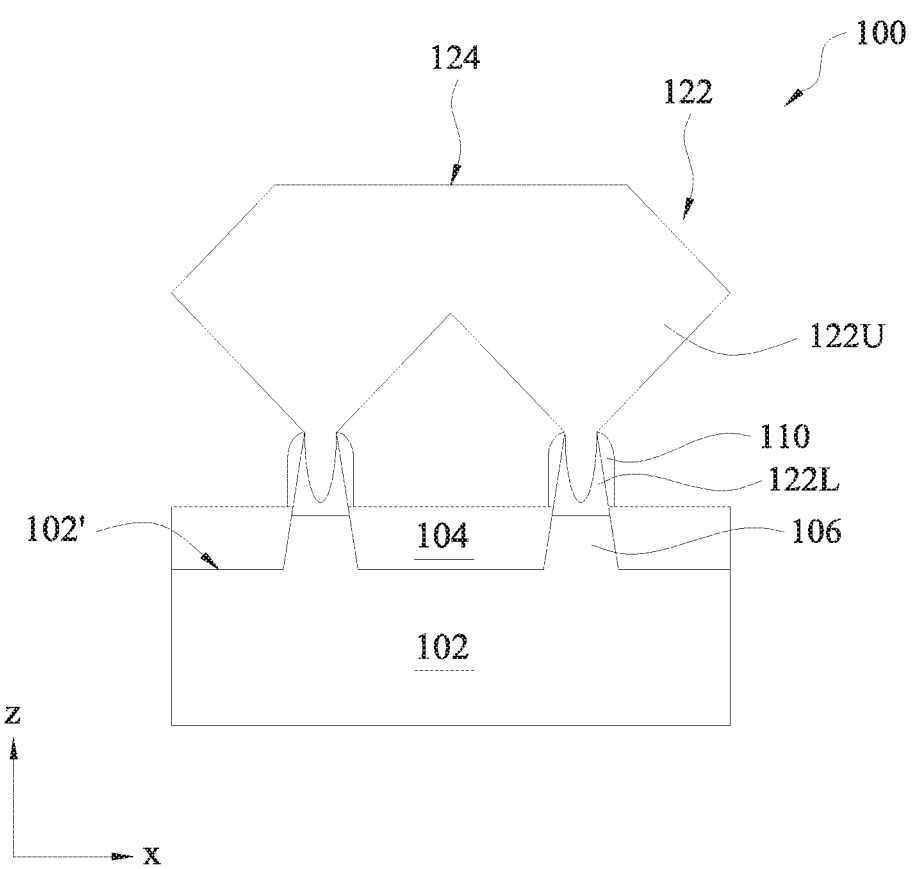
Figure 9B:
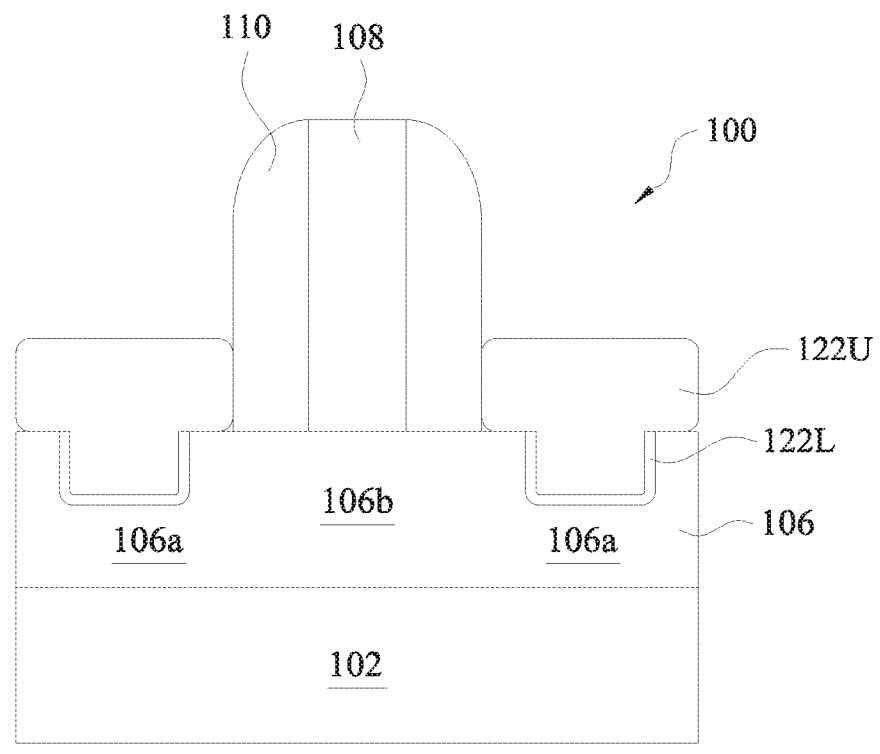

At operation 212, the method 200 (FIG. 2) changes the growth condition for the epitaxial feature 122U and continues growing the epitaxial feature 122U to have a substantially flat top surface 124 as shown in FIG. 9A, which is a cross-sectional view of the device 100 along the "1-1" line of FIG. 3. FIG. 9B illustrates a cross-sectional view of the device 100 along the "2-2" line of FIG. 3 at this fabrication stage. In an embodiment, the method 200 switches from operation 210 to operation 212 when the individual epitaxial features 122U start merging and the merged epitaxial feature 122U reaches a target critical dimension (CD), for example, when its dimension "b" (FIG. 1D) reaches a certain value (e.g., at least 1.5 times of the pitch "p") or when its thickness "$h_1$" at the bottom of the dip 116 reaches a certain value such as from a quarter to a third of the desired height "h." In an embodiment, the method 200 switches from operation 210 to operation 212 when $h_1$ is about 5 to 10 nm.

In an embodiment, operation 212 uses a different deposition precursor or a different etching gas than operation 210 does. In another embodiment, operation 212 uses a different (in type or amount) etching gas than operation 210 does but with the same deposition precursor. The different deposition precursor or etching gas results in more crystal growth (or deposition) in the dip 116 (FIG. 8A) than in other areas of the epitaxial features 122U. In other words, although semiconductor materials also grow (or are deposited) on side and bottom surfaces of the epitaxial feature 122U, the growth (or deposition) on its top surface 115 is much faster. As a result, the dip 116 is filled with the respective semiconductor material (e.g., silicon or silicon germanium) and the epitaxial feature 122U is grown to have a substantially flat top surface 124.

In an embodiment, operation 210 grows the epitaxial features 122U using dichlorosilane ($SiH_2Cl_2$) (also known as DCS) as a precursor to form silicon crystal. To further this embodiment, operation 212 adds a silane to the precursor in order to have a higher growth (or deposition) rate in the dip 116. In an embodiment, the silane is $SiH_4$. In an embodiment, the ratio of $SiH_4$ to DCS in operation 212 ranges from about 0.005 to about 0.05. In another embodiment, operation 210 grows the epitaxial features 122U using HCl as the etching gas and a gas mixture of $GeH_4$ and $H_2$ as the deposition gas so as to form silicon germanium crystal. To further this embodiment, operation 212 reduces the flow rate of the HCl so that silicon germanium is deposited faster in the dip 116 than in other areas of the epitaxial feature 122U. In an embodiment, the HCl flow rate in operation 212 ranges from about 100 to about 400 standard cubic centimeters per minute (sccm). By virtue of the operations 208, 210, and 212, the device 100 is provided with raised S/D features 122 which have substantially flat top surfaces 124. In various embodiments, the operations 210 and 212 may be performed at a pressure ranging from 200 to 350 Torr, and at a temperature ranging from 650 to 720 degrees Celsius.

At operation 214, the method 200 (FIG. 2) proceeds to further operations to form a final device. This includes a variety of processes. In one example, silicidation or germano-silicidation are formed on the epitaxial feature 122U. For example, silicidation, such as nickel silicide, may be formed by depositing a metal layer over the epitaxial feature 122U, annealing the metal layer such that the metal layer reacts with silicon in the epitaxial features 122U to form the metal silicidation, and thereafter removing the non-reacted metal layer.

Figure 10:
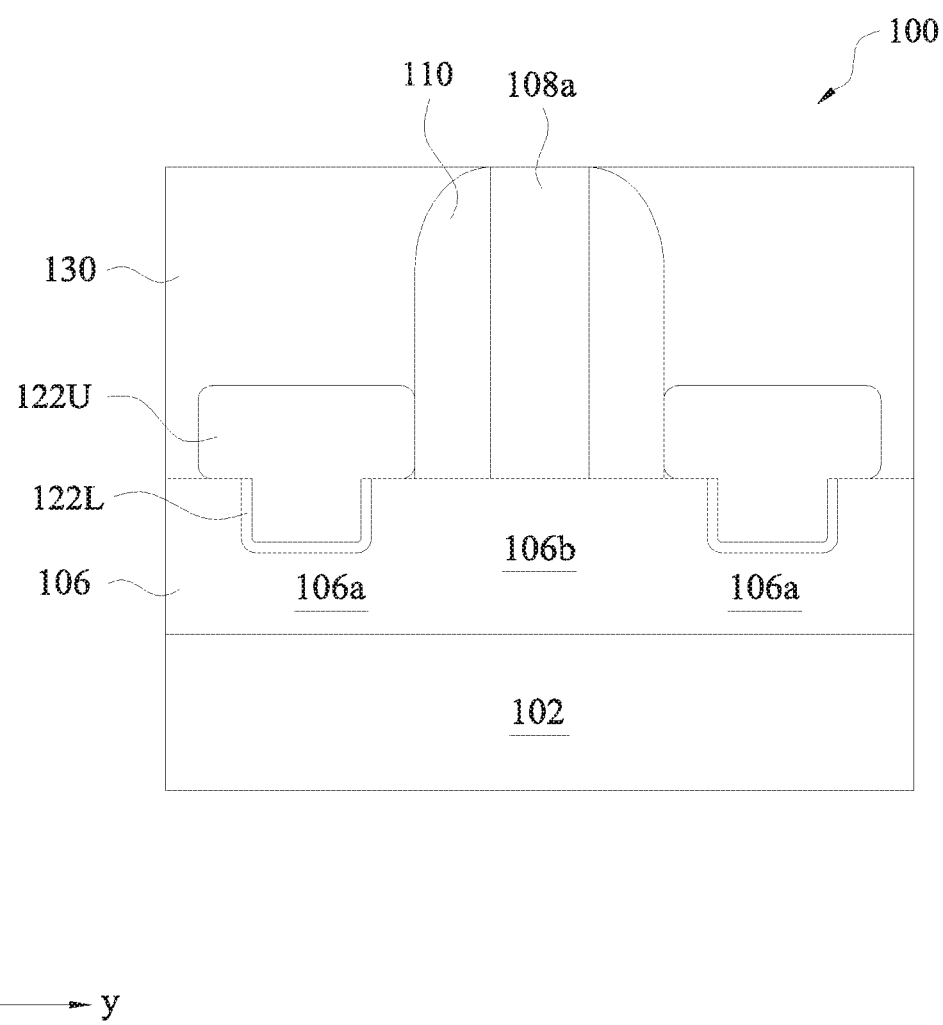

In another example, operation 214 replaces the gate stack 108 with a final gate stack 108a as shown in FIG. 10. To further this example, the gate stack 108 is a placeholder having a dummy gate dielectric layer (e.g., silicon oxide) and a dummy gate electrode layer (e.g., polysilicon), while the gate stack 108a is a high-k metal gate having a high-k gate dielectric layer, an appropriate n-type or p-type work function layer, and a metal fill layer. The high-k gate dielectric layer, the work function layer, and the metal fill layer may use the suitable materials discussed with reference to FIG. 3. To further this example, operation 214 may deposit a low-k dielectric layer 130 over the substrate 102 to cover the topography thereon. The dielectric layer 130 may include materials such as tetraethylorthosilicate (TEOS) oxide, doped or un-doped silicate glass, fused silica glass (FSG), and/or other suitable dielectric materials. The dielectric layer 130 may be deposited by a PECVD process, flowable CVD (FCVD), or other suitable deposition technique. In some embodiment, a contact etch stop layer (not shown) having a dielectric material such as silicon nitride may be deposited underneath the low-k dielectric layer 130. After the dielectric layer 130 has been deposited, operation 214 removes the gate stack 108 using one or more etching processes and forms the final gate stack 108a in place of the gate stack 108 using one or more deposition processes.

Figure 11:
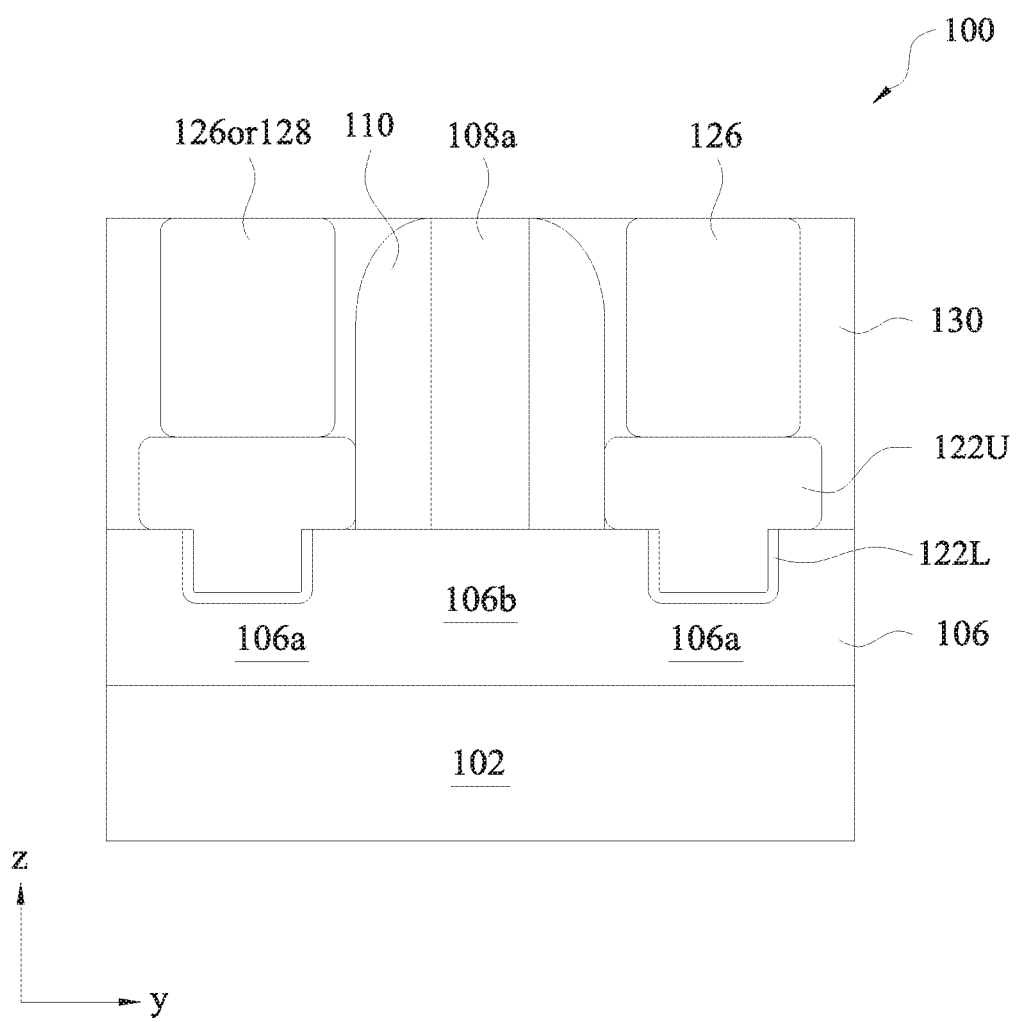

In a further example, operation 214 forms the S/D contacts 126 or 128 over the epitaxial features 122U and electrically connecting to the epitaxial features 122U, as shown in FIG. 11. This involves a variety of processes. For example, operation 214 may perform one or more lithography processes and etching processes to form contact holes through the dielectric layer 130. The contact holes expose the epitaxial features 122U (or the silicidation or germano-silicidation thereon). In an embodiment, the contact holes extend below the widest part of the epitaxial features 122U such as shown in FIGS. 1C and 1D. Then, operation 214 deposits a barrier layer (e.g., 126a or 128a) on bottom and sidewalls of the contact holes to prevent metal materials of the S/D contacts 126 or 128 from diffusing into adjacent features. The barrier layer includes a dielectric material, such as TaN in one example. Subsequently, operation 214 deposits a metal layer (e.g., 126b or 128b) to fill the remaining spaces in the contact holes. The S/D contacts 126 or 128 include the barrier layer and the metal layer in this embodiment. The deposition of the barrier layer and the metal layer may use a conformal or non-conformal deposition process. In both cases, a large interface between the S/D contacts 126 or 128 and the underlying epitaxial features 122U results from the substantially flat top surface 124 of the epitaxial feature 122U. The large interface advantageously reduces the S/D contact resistance.

Although not intended to be limiting, one or more embodiments of the present disclosure provide many benefits to a semiconductor device and the formation thereof. For example, raised S/D features can be grown to have a substantially flat top surface. The substantially flat top surface provides a large interface between the S/D features and S/D contacts disposed thereon. The large interface may be achieved with either conformal or non-conformal S/D contact deposition, simplifying the fabrication process. In embodiments of the present disclosure, the geometry of the S/D features may be tuned by changing the epitaxial growth condition at certain fabrication stage. Various embodiments of the present disclosure may be easily integrated into existing manufacturing processes.

In one exemplary aspect, the present disclosure is directed to a semiconductor device. The semiconductor device comprises a substrate; an isolation structure over the substrate; two fins over the substrate and protruding out of the isolation structure; and an epitaxial feature over the two fins. The epitaxial feature comprises two lower portions and one upper portion. The two lower portions are over the two fins respectively. The upper portion is over the two lower portions. The upper portion has a different dopant concentration than the two lower portions. A top surface of the upper portion is substantially flat.

In another exemplary aspect, the present disclosure is directed to a semiconductor device. The semiconductor device comprises a substrate; an isolation structure over the substrate; two fins over the substrate and protruding out of the isolation structure; and an epitaxial feature over the two fins. The epitaxial feature includes two lower portions and one upper portion. The two lower portions are over the two fins respectively. The upper portion is over the two lower portions and physically connects the two lower portions. A top surface of the upper portion is substantially flat and is substantially parallel to a top surface of the substrate. The upper portion and the two lower portions have a same type of dopant but with different dopant concentrations.

In another exemplary aspect, the present disclosure is directed to a method of forming a semiconductor device. The method includes providing a substrate, an isolation structure over the substrate, and at least two fins extending from the substrate and through the isolation structure. The method further includes etching the at least two fins, thereby forming at least two trenches. The method further includes growing first epitaxial features in the at least two trenches and growing second epitaxial features over the first epitaxial features in a first growth condition. After the second epitaxial features reach a target critical dimension, the method further includes growing the second epitaxial features in a second growth condition different from the first growth condition.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
an isolation structure over the substrate;
two fins extending from the substrate and extending partially through the isolation structure;
an epitaxial feature over the two fins;
a first set of sidewall dielectric features disposed on the isolation structure such that the first set of sidewall dielectric features are above and on opposing sides of a first fin of the two fins; and
a second set of sidewall dielectric features disposed on the isolation structure such that the second set of sidewall dielectric features are above and on opposing sides of a second fin of the two fins,
wherein:
the epitaxial feature comprises two lower portions and an upper portion;
a first of the two lower portions extends from the first fin and extends above the isolation structure between the first set of sidewall dielectric features;
a second of the two lower portions extends from the second fin and extends above the isolation structure between the second set of sidewall dielectric features;
the upper portion is over the two lower portions;
the upper portion extends partially through each of the two lower portions in a cross section perpendicular to a lengthwise direction of the first and second fins;
a part of the first of the two lower portions is laterally between the first set of sidewall dielectric features and the upper portion in the cross section;
a part of the second of the two lower portions is laterally between the second set of sidewall dielectric features and the upper portion in the cross section;
the upper portion has a different dopant concentration than the two lower portions; and
a top surface of the upper portion is substantially flat.

2. The semiconductor device of claim 1, wherein a first dimension of the upper portion along a fin width direction is greater than a second dimension of the upper portion along a fin height direction.

3. The semiconductor device of claim 1, wherein the upper portion extends beyond the two lower portions along a fin width direction, and extensions of the upper portion to a left side and a right side of the two lower portions have different thickness.

4. The semiconductor device of claim 1, wherein the epitaxial feature comprises silicon with an n-type dopant.

5. The semiconductor device of claim 4, wherein the upper portion has a higher concentration of the n-type dopant than the two lower portions have.

6. The semiconductor device of claim 1, wherein the two fins have a channel region interposing two source/drain (S/D) regions, and the epitaxial feature is over one of the two S/D regions, further comprising:
a gate stack over the isolation structure and engaging the channel region of the two fins.

7. The semiconductor device of claim 1, further comprising a contact feature over the top surface of the epitaxial feature and electrically connects to the epitaxial feature.

8. The semiconductor device of claim 7, further comprising:
a third fin over the substrate and protruding out of the isolation structure; and
another epitaxial feature over the third fin, wherein:
the epitaxial feature and the another epitaxial feature include different semiconductor materials; and
the contact feature is over a surface of the another epitaxial feature and electrically connects to the another epitaxial feature.

9. The semiconductor device of claim 8, wherein the epitaxial feature includes n-type doped silicon and the another epitaxial feature includes p-type doped silicon germanium.

10. The semiconductor device of claim 1, wherein:
the first of the two lower portions extends from below a topmost surface of the isolation structure to a top of the first set of sidewall dielectric features, and
the upper portion interfaces with the first of the two lower portions below the top of the first set of sidewall dielectric features.

11. A semiconductor device, comprising:
a substrate;
an isolation structure over the substrate;

first and second fins extending from the substrate and partially through the isolation structure;

a first set of dielectric features disposed on the isolation structure and on opposing sides of the first fin;

a second set of dielectric features disposed on the isolation structure and on opposing sides of the second fin; and an epitaxial feature over the first fin and the second fin, wherein:

the epitaxial feature includes a first lower portion over the first fin, a second lower portion over the second fin, and an upper portion;

the first lower portion extends between the first set of dielectric features and partially through the isolation structure;

the second lower portion extends between the second set of dielectric features and partially through the isolation structure;

the upper portion is over the first and second lower portions and extends between the first and second sets of dielectric features to connect the first and second lower portions;

a first part of the upper portion is surrounded by the first lower portion in a cross section perpendicular to a lengthwise direction of the first and second fins;

a second part of the upper portion is surrounded by the second lower portion in the cross section;

a part of the first lower portion is laterally between the first set of dielectric features and the upper portion in the cross section;

a part of the second lower portion is laterally between the second set of dielectric features and the upper portion in the cross section; and a top surface of the upper portion is substantially flat and is substantially parallel to a top surface of the substrate, the upper portion and the first and second lower portions have a same type of dopant at different dopant concentrations.

12. The semiconductor device of claim 11, wherein the first and second fins have a pitch ranging from 30 nanometer (nm) to 50 nm, and a dimension of the upper portion along a fin width direction ranges from 55 nm to 75 nm.

13. The semiconductor device of claim 11, wherein the first and second lower portions comprise silicon with a first concentration of an n-type dopant, the upper portion comprises silicon with a second concentration of the n-type dopant, and the second concentration is higher than the first concentration.

14. A semiconductor device, comprising:

a substrate;

an isolation structure over the substrate;

first and second fins over the substrate and within the isolation structure;

first and second sets of sidewall dielectric features disposed such that the first set of sidewall dielectric features is on opposing sides of the first fin and the second set of sidewall dielectric features is on opposing sides of the second fin;

a first epitaxial feature over the first and second fins, wherein:

the first epitaxial feature includes two lower portions and an upper portion;

the two lower portions are within the isolation structure over the first and second fins respectively and extend between the first and second sets of sidewall dielectric features respectively to a height above the isolation structure;

the upper portion is over the two lower portions and physically contacts the two lower portions;

a first part of the upper portion is sandwiched within a first of the two lower portions in a cross section perpendicular to a lengthwise direction of the first and second fins;

a second part of the upper portion is sandwiched within a second of the two lower portions in the cross section;

a bottom surface of the upper portion between the first and second fins is vertically spaced from the isolation structure; and a top surface of the upper portion is substantially flat, wherein the upper portion and the two lower portions have a same type of dopant at different dopant concentrations;

a third fin over the substrate and within the isolation structure;

a second epitaxial feature over the third fin, wherein the first and second epitaxial features include different semiconductor materials; and a conductive feature physically contacts the first and second epitaxial features.

15. The semiconductor device of claim 14, wherein a portion of the conductive feature extends downwards between the first and second epitaxial features.

16. The semiconductor device of claim 14, wherein the first epitaxial feature includes n-type doped silicon and the second epitaxial feature includes p-type doped silicon germanium.

17. The semiconductor device of claim 14, wherein extensions of the upper portion to a left side and a right side of the two lower portions along a fin width direction are asymmetrical.

18. The semiconductor device of claim 17, wherein a dimension of the upper portion along the fin width direction ranges from 55 nm to 75 nm, and each of the extensions of the upper portion ranges from 10 nm to 25 nm.

19. The semiconductor device of claim 14, wherein the second epitaxial feature includes a second lower portion and a second upper portion partially embedded in the second lower portion, wherein the upper portion of the first epitaxial feature is partially embedded in the two lower portions of the first epitaxial feature.

20. The semiconductor device of claim 14, wherein the bottom surface of the upper portion between the first and second fins is flat.

* * * * *